(12) United States Patent
Kim et al.

(10) Patent No.: US 9,299,428 B2
(45) Date of Patent: Mar. 29, 2016

(54) RESISTIVE MEMORY APPARATUS AND OPERATION METHOD THEREOF

(71) Applicant: SK hynix Inc., Gyeonggi-do (KR)

(72) Inventors: Ka Young Kim, Gyeonggi-do (KR); Hae Chan Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 7 days.

(21) Appl. No.: 14/316,365

(22) Filed: Jun. 26, 2014

(65) Prior Publication Data

US 2015/0228336 A1    Aug. 13, 2015

(30) Foreign Application Priority Data

Feb. 13, 2014  (KR) .................. 10-2014-0016576

(51) Int. Cl.
  *G11C 11/00* (2006.01)
  *G11C 13/00* (2006.01)
  *G11C 11/16* (2006.01)

(52) U.S. Cl.
  CPC ........ *G11C 13/0033* (2013.01); *G11C 13/0004* (2013.01); *G11C 13/0035* (2013.01); *G11C 13/0069* (2013.01); *G11C 11/1675* (2013.01); *G11C 13/0007* (2013.01)

(58) Field of Classification Search
  CPC ... G11C 11/16; G11C 14/009; G11C 14/0045
  USPC ................... 365/148, 163, 171, 173
  See application file for complete search history.

(56) References Cited

U.S. PATENT DOCUMENTS

| | | | | |
|---|---|---|---|---|
| 2004/0083335 | A1* | 4/2004 | Gonzalez | G06F 12/0246 711/103 |
| 2007/0208904 | A1* | 9/2007 | Hsieh | G06F 12/0246 711/103 |
| 2007/0245067 | A1* | 10/2007 | Yero | G06F 12/0246 711/103 |
| 2012/0311228 | A1* | 12/2012 | Hsu et al. | G06F 12/0246 711/102 |

FOREIGN PATENT DOCUMENTS

KR    100548089    2/2006

* cited by examiner

*Primary Examiner* — Han Yang
(74) *Attorney, Agent, or Firm* — IP & T Group LLP

(57) ABSTRACT

A resistive memory apparatus includes a memory region including a plurality of resistive memory cells, and a controller suitable for storing a threshold number of write operations according to a data storage material of the resistive memory cells, counting numbers of write operations for the respective resistive memory cells as a write operation is performed for the memory region, and performing interrupt control when a memory cell that reaches the threshold number of write operations is detected.

20 Claims, 8 Drawing Sheets

(a)

(b)

RESISTIVE MEMORY APPARATUS AND OPERATION METHOD THEREOF

CROSS-REFERENCES TO RELATED APPLICATION

The present application claims priority under 35 U.S.C. §119(a) to Korean application number 10-2014-0016576, filed on Feb. 13, 2014, in the Korean Intellectual Property Office, which is incorporated herein by reference in its entirety.

BACKGROUND

1. Technical Field

Various embodiments relate to a semiconductor apparatus, and more particularly, to a resistive memory apparatus and an operation method thereof.

2. Related Art

Resistive memory is being highlighted as the next generation of memory having advantages such as low cost, random access, high speed operation, low power consumption and nonvolatile properties.

Resistive memory has a data storage material layer disposed between a pair of electrodes, and stores data by changing the resistive state of the data storage material layer through application of current or a voltage.

Phase change memory, a type of resistive memory, includes an access element, a bottom electrode formed on the access element, and a data storage material layer or a resistor element formed between the bottom electrode and a top electrode. If the access element is driven through a word line to write data in the phase change memory, as write current is applied from a bit line to the resistor element, the resistive state of the resistor element may change between a crystalline state (a low resistive state) and an amorphous state (a high resistive state).

Heat is generated while writing to phase change memory cells and this heat may reach neighboring cells. If the neighboring cells are in the resistive state, or are storing data, and the temperature of the neighboring cells reach the crystallization temperature, the resistive state of the neighboring cell may change. This is referred to as a disturbance phenomenon.

Further, if phase change memory cells spend a given amount of time at a certain temperature, the data storage material in the high resistive state is crystallized and data may be erased.

FIG. 1 is a diagram illustrating a disturbance phenomenon of a resistive memory apparatus. In FIG. 1, the reference symbol BE represents the bottom electrode, TE the top electrode, and PCM a phase change material acting as the data storage material.

As shown in FIG. 1 (a), during the writing operation on a selected cell, heat is radiated to an adjacent cell, which is in an amorphous state.

Also, as shown in FIG. 1 (b), where the write operation for the selected cell is repeated a certain number of times, the adjacent cell is likely to be crystallized.

That is, as the write operation is repeated for the selected cell, the data of the adjacent cell is deleted due to the disturbance phenomenon.

With time, the resistive state of an adjacent cell, written to an amorphous state and repeatedly exposed to heat radiated from a selected cell, is crystallized to be in a low resistive state. Also, the resistive state of an adjacent cell is influenced by write pulse duration for the writing operation on a selected cell, and the distance from the selected cell to the adjacent cell.

SUMMARY

In an embodiment of the present disclosure, a resistive memory apparatus may include a memory region including a plurality of resistive memory cells; and a controller suitable for storing a threshold number of write operations according to a data storage material of the resistive memory cells, counting numbers of write operations for the respective resistive memory cells as a write operation is performed for the memory region, and performing interrupt control when a memory cell that reaches the threshold number of write operations, is detected.

An embodiment of the present disclosure is found in a method for operating a resistive memory apparatus which may include a controller suitable for controlling a write operation for a memory region including a plurality of resistive memory cells, and for storing a threshold number of write operations according to the data storage material of the resistive memory cells, the method including counting numbers of write operations for the respective resistive memory cells as the write operation is performed for the memory region; and performing interrupt control when a memory cell, the number of write operations of which reaches the threshold number of write operations, is detected.

In an embodiment of the present disclosure, a resistive memory apparatus may include a plurality of resistive memory cells and a controller suitable for detecting an overwritten resistive memory cell from the multiple resistive memory cells, and allowing the resistive memory apparatus to perform a write operation to another from the multiple resistive memory cells in response to a write command for a write operation to the detected overwritten resistive memory cell, wherein a predetermined number of write operations is performed to the overwritten resistive memory cell.

In an embodiment of the present disclosure, a resistive memory apparatus may include a plurality of resistive memory cells and a controller suitable for detecting an overwritten resistive memory cell from the multiple resistive memory cells, and allowing the resistive memory apparatus to perform a refresh operation to an adjacent resistive memory cell of the detected overwritten resistive memory cell, wherein a predetermined number of write operations is performed to the overwritten resistive memory cell.

BRIEF DESCRIPTION OF THE DRAWINGS

Features, aspects, and embodiments are described in conjunction with the attached drawings, in which.

DETAILED DESCRIPTION

A resistive memory apparatus and an operation method thereof according to the present disclosure will be described below with reference to the accompanying drawings through exemplary embodiments.

Figure 1:
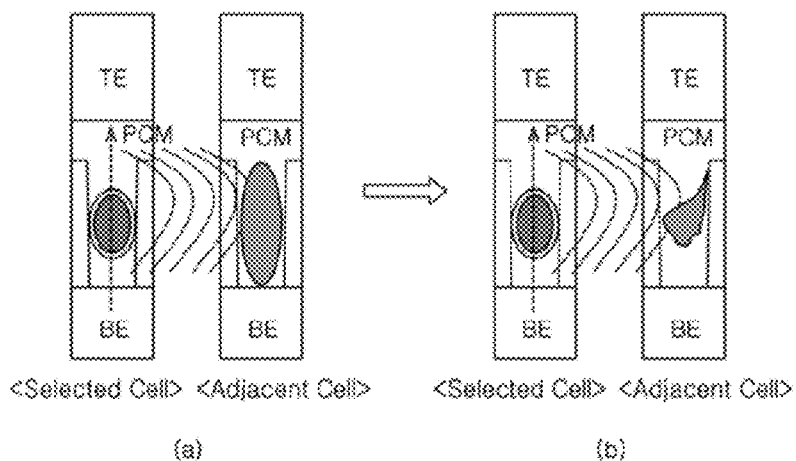
FIG. 1 is a diagram illustrating a disturbance phenomenon of a resistive memory apparatus.
Figure 2:
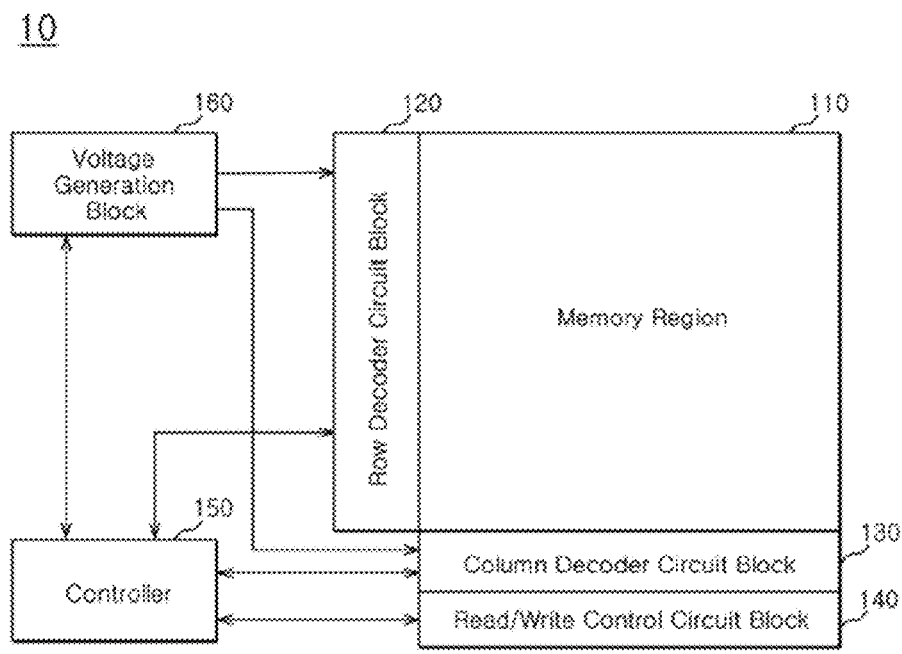
FIG. 2 is a block diagram illustrating a resistive memory apparatus in accordance with an embodiment of the present disclosure.

FIG. 2 is a block diagram illustrating a resistive memory apparatus in accordance with an embodiment of the present disclosure.

A resistive memory apparatus 10 in accordance with an embodiment of the present disclosure may include a memory region 110, a row decoder circuit block 120, a column decoder circuit block 130, a read/write control circuit block 140, a controller 150, and a voltage generation block 160.

The memory region 110 may include an array of resistive memory cells electrically coupled between word lines and bit lines. Non-limiting examples of resistive memory cells may include phase change memory cells using a chalcogenide compound, magnetic memory cells adopting a magnetic tunneling effect, resistive memory cells using a transition metal oxide, polymer memory cells, memory cells using perovskite, and ferroelectric memory cells using ferroelectric capacitors. The resistive memory cells may be multi-level cells each capable of storing two or more bits of data.

Figure 3:
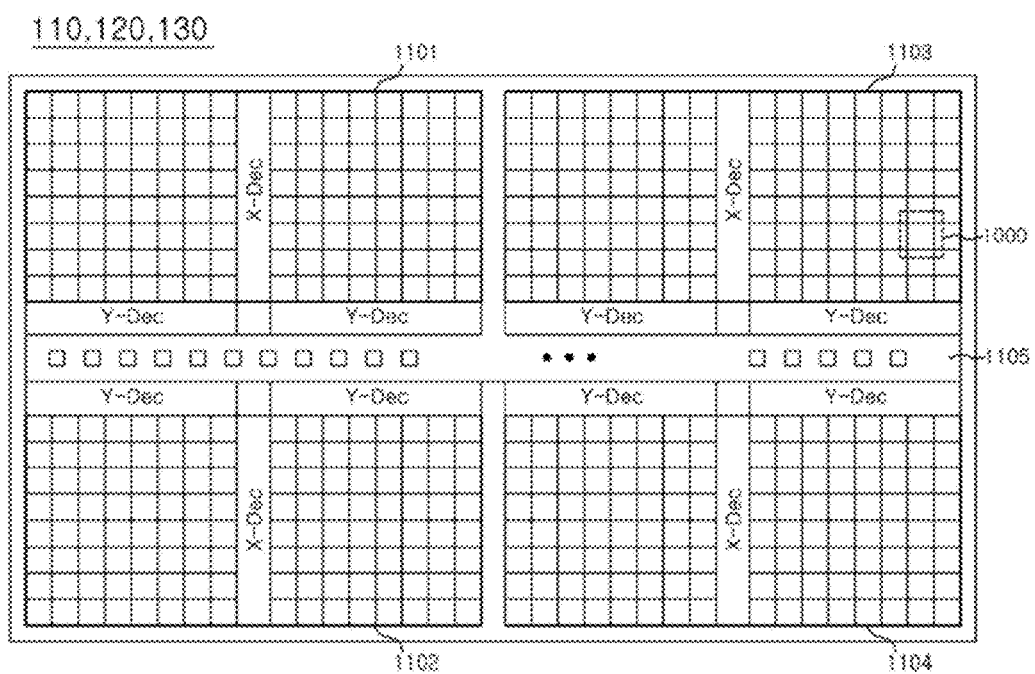
FIG. 3 is a view exemplarily illustrating a memory region, a row decoder circuit block and a column decoder circuit block shown in FIG. 2.

FIG. 3 is a view exemplarily illustrating the memory region 110, the row decoder circuit block 120 and the column decoder circuit block 130 shown in FIG. 2.

Referring to FIG. 3, the memory region 110 may include one or more mats 1101, 1102, 1103 and 1104. Each of the mats 1101, 1102, 1103 and 1104 may include a plurality of unit memory cell arrays 1000. One or more memory cells may be selected by decoders X-DEC and Y-DEC according to an address for access to the memory cells.

On the sides of the mats 1101, 1102, 1103 and 1104, for example, between upper mats 1101 and 1103 and lower mats 1102 and 1104, there may be arranged a peripheral circuit region 1105. Address/command processing units, data input/output processing units, power supply units, and so forth may be disposed in the peripheral circuit region 1105. Data input/output pads, address pads, command pads, power pads (power supply voltage pads and ground voltage pads), and so forth may also be disposed in the peripheral circuit region 1105.

Referring back to FIG. 2, the row decoder circuit block 120 and the column decoder circuit block 130 as address decoders may be respectively applied with external address signals. The row decoder circuit block 120 and the column decoder circuit block 130 may decode the row address and the column address, that is, the word line address and the bit line address, for access to a memory cell in the memory region 110, under the control of the controller 150.

The read/write control circuit block 140 may be provided with data from a data input/output circuit block (not shown) and write the data in the memory region 110 under the control of the controller 150, or may provide the data, which is read from a selected memory cell of the memory region 110, to the data input/output circuit block under the control of the controller 150.

The controller 150 may write data in the memory region 110 by controlling the row decoder circuit block 120, the column decoder circuit block 130 and the read/write control circuit block 140 in response to a write command, which is inputted from an external device or a host. Further, the controller 150 may read data from the memory region 110 by controlling the row decoder circuit block 120, the column decoder circuit block 130 and the read/write control circuit block 140 in response to a read command, which is inputted from the external device or the host.

The voltage generation block 160 may generate operating voltages, such as a write voltage for a write operation, a read voltage for verification and a read voltage for a read operation, according to the control of the controller 150, and provide the operating voltages to the row decoder circuit block 120, the column decoder circuit block 130, etc.

In an embodiment of the present disclosure, the controller 150 may store a predetermined threshold number of write operations according to the kind of a data storage material of resistive memory cells, and count the number of write operations per memory cell. When the number of write operations for a certain memory cell reaches the predetermined threshold number of write operations, the controller 150 may perform interrupt control. A memory cell which has performed a predetermined threshold number of write operations will be referred to as an overwritten memory cell.

The interrupt control may be performed to the overwritten memory cell when the write operation is to be performed to the overwritten memory cell. As the interrupt control, the controller 150 may substitute a memory cell for the overwritten memory cell, or the controller 150 may refresh an adjacent cell of the overwritten memory cell.

In an embodiment of the present disclosure, when the overwritten memory cell is detected, the controller 150 may control the row decoder circuit block 120 and the column decoder circuit block 130 in such a way that another memory cell, which may not be affected by the disturbance of the overwritten memory cell, for example a memory cell of a mat other than a mat including the overwritten memory cell, may be substituted for the overwritten memory cell in the next write operation for the overwritten memory cell, and may then allow the write operation to be performed by the read/write control circuit block 140. In this case, the controller 150 may perform a write operation to another memory cell instead of the overwritten memory cell by substituting an address for access to another memory cell for the overwritten memory cell's original address provided from the external device or the host. In addition, the controller 150 may generate and manage an address table by mapping the original address and the substituted address.

In another embodiment, when the overwritten memory cell is detected, the controller 150 may perform a refresh operation, that is, a data rewrite operation, for an adjacent memory cell of the overwritten memory cell. After the refresh operation is performed for the adjacent memory cell, a write operation may be resumed for the overwritten memory cell.

The adjacent memory cell, which may be affected by the disturbance of the overwritten memory cell and thereby crystallized, may be a written memory cell having an amorphous state or a high resistive state. In an embodiment of the present disclosure, the interrupt control may be performed according to the resistive state of the adjacent memory cell of the overwritten memory cell. In other words, when the overwritten memory cell is detected, the interrupt control may be performed to the adjacent memory cell which is in a high resistive state, while the interrupt control would not be performed to the adjacent memory cell in a low resistive state.

The threshold number of the write operations, which may be a criterion for determination of the overwritten memory cell, may be determined according to the activation energy (Ea) of the data storage material of the resistive memory apparatus. The activation energy of a data storage material, in particular, a phase change material, may be determined by the crystallization temperature Tc and time by which the state of the phase change material is changed from the amorphous state to the crystalline state. Activation energy may vary according to the data storage material.

In detail, between an initial arrangement state and a final arrangement state of atoms or molecules, there exists an intermediate arrangement state, in which energy produced by interatomic forces or intermolecular forces becomes the maximum. This intermediate arrangement state is referred to as the transition state, and an energy difference between the transition state and the initial arrangement state is referred to as activation energy. Namely, the activation energy is the minimum amount of energy required to initiate a conversion in a reaction system.

It is possible to measure the activation energy for a data storage material required for the phase change from the amorphous state to the crystalline state by measuring time required for crystallization of the data storage material while raising the temperature applied to the data storage material.

Figure 4:
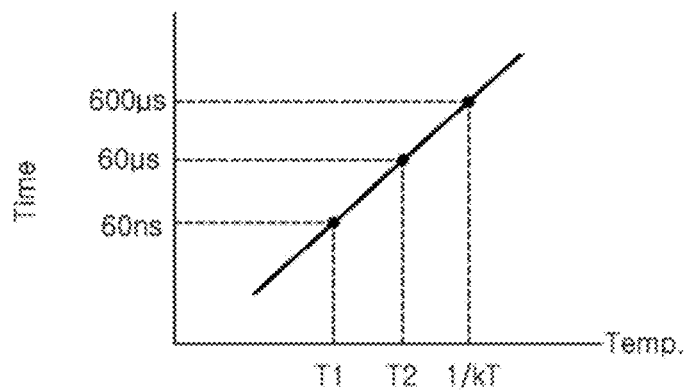
FIG. 4 is a graph illustrating the relationship between temperature and data retention failure time of a resistive memory apparatus.

FIG. 4 is a graph illustrating the relationship between variations of temperature and write pulse duration of a data storage material.

Write pulses having duration of 60 ns per one cycle are applied 1 time (60 ns), $10^3$ times (60 μs) and $10^4$ times (600 μs) to a data storage material, and the temperature for crystallization of the data storage material is measured. The activation energy may be measured from a slop of graph. In FIG. 4, k is the Boltzmann's constant, and T is the absolute temperature.

Figure 5:
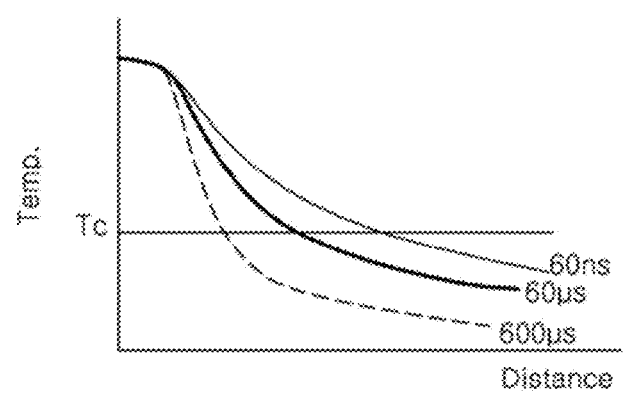
FIG. 5 is a graph illustrating changes in distance between the memory cells subject to a crystallization temperature according to write pulse duration in a write operation of a resistive memory apparatus.

FIG. 5 is a graph explaining the relationship between distance to adjacent memory cells from selected memory cell and the crystallization temperature Tc of adjacent memory cells according to write pulse duration in the write operation of a resistive memory apparatus.

When write pulse having duration of 60 ns per one cycle is applied 1 time, $10^3$ times (60 μs) and $10^4$ times (600 μs) to a data storage material, the crystallization temperature Tc are different for each adjacent memory cells according to distance adjacent memory cells from selected memory cell.

An adjacent memory cell applying write pulse for a longer time among adjacent memory cells which are located in same distance from selected memory cell is easily crystallized, and disturbance is caused faster.

As shown in FIGS. 4 and 5, as the number of repetition times of a write operation to be performed for a memory cell increases and a distance between memory cells becomes shorter, disturbance increases.

Figure 6:
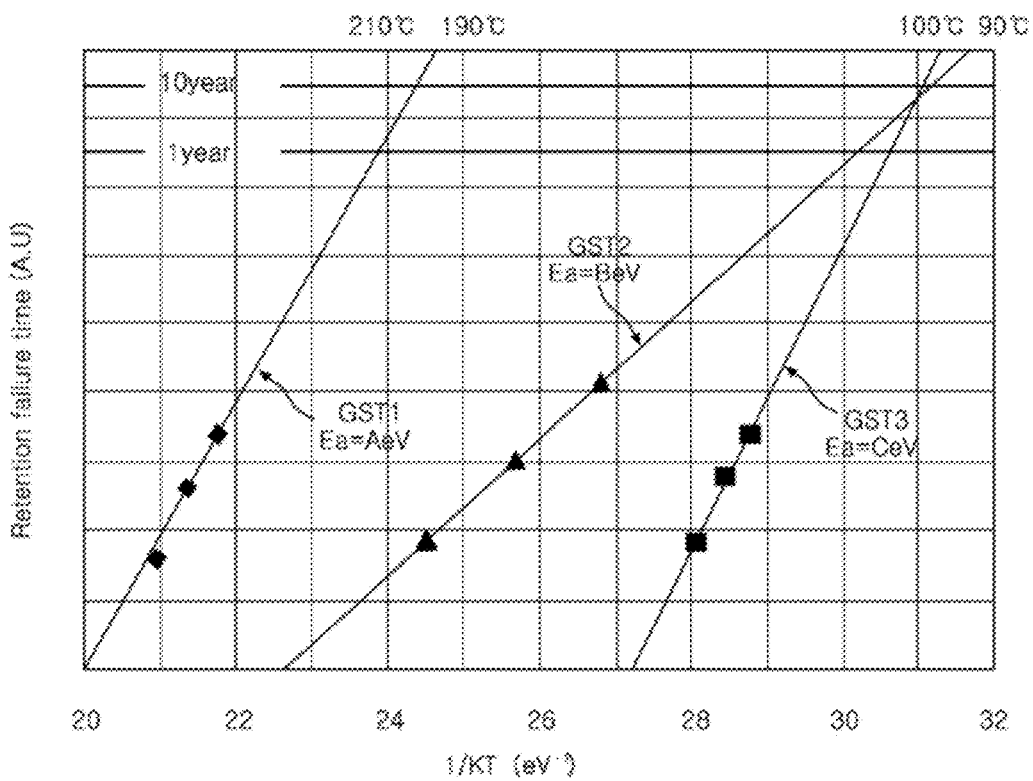
FIG. 6 is a graph illustrating data retention failure time represented by a temperature function according to a data storage material of a resistive memory apparatus.

FIG. 6 is a graph illustrating data retention failure time (in log scales) represented by a temperature function (1/kT) according to the kind of a data storage material of a resistive memory apparatus.

The activation energy Ea may be determined by the following equation.

$$Ea = \frac{d\ln(tx)}{d(1/kT)} \quad \text{[Equation 1]}$$

For example, as shown in FIG. 6, the activation energy Ea of a data storage material including a first chalcogenide (GeSbTe, GST) material GST1 may be AeV, and data may be retained in the data storage material including the first GST material GST1 for 10 years at approximately 200° C. Also, the activation energy Ea of a data storage material including a second GST material GST2 may be BeV, and data may be retained in the data storage material including the 20 second GST material GST2 for 10 years at approximately 93° C. Also, the activation energy Ea of a data storage material including a third GST material GST3 may be CeV, and data may be retained in the data storage material including the third GST material GST3 for 10 years at approximately 97° C.

The first GST material GST1 may be, for example, a Ge-rich GST material, and the activation energy Ea of the Ge-rich GST material may be 2 to 6 eV. The second GST material GST2 may be a general GST material, and the activation energy Ea of the general GST material may be 1 to 4 eV. The third GST material GST3 may be, for example, a Sb-rich GST material, and the activation energy Ea of the Sb-rich GST material may be 3 to 8 eV.

In accordance with an embodiment of the present disclosure, the threshold number of write operations of a memory cell may be predetermined based on the activation energy, which includes information on the data retention failure time and the temperature for change of the data storage material from the amorphous state to the crystalline state, and the write pulse durations per cycle. The predetermined threshold number of write operations may be the criterion for determination of the overwritten memory cell, and for determination of whether a memory cell may affect an adjacent cell due to the disturbance and thus may change the resistive state of the adjacent cell. For instance, it is possible to obtain the threshold number of write operations of a memory cell by dividing the data retention failure time by the write pulse duration.

Figure 7:
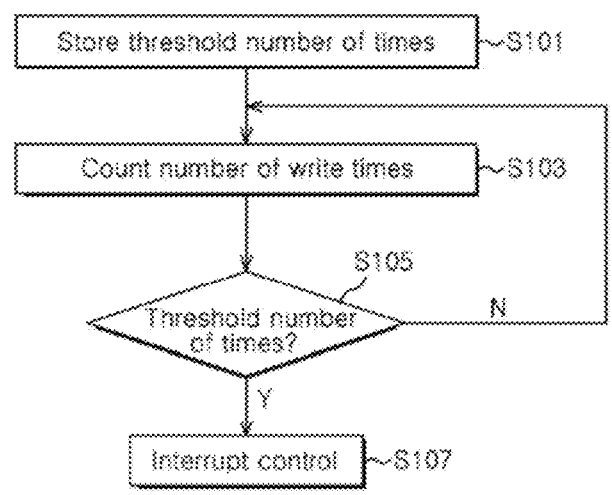
FIG. 7 is a flow chart illustrating a method for operating a resistive memory apparatus in accordance with an embodiment of the present disclosure.

Thus, as shown in FIG. 7, which is a flow chart illustrating a method for operating a resistive memory apparatus in accordance with an embodiment of the present disclosure, the controller 150 may store the predetermined threshold number of write operations based on the activation energy (Ea) of the memory region 110 and write pulse duration (S101), and may count the number of write operations for respective cells (S103). If a cell of the predetermined threshold number of write operations is detected, or an overwritten memory cell is detected (S105), the controller 150 may perform the interrupt control described above (S107).

For example, the data retention failure time of a data storage material may be 6 s and the write pulse duration for the data storage material may 60 ns per cycle. In a resistive memory apparatus having a data storage material with the previous characteristics, no influence may be exerted on an adjacent cell of a selected memory cell for the write operation until the number of write operations to the selected memory cell reaches 1E8 cycles (1E8=6 s/60 ns) or the predetermined threshold number of write operations, or until the selected memory cell becomes the overwritten memory cell. The adjacent cell in the amorphous state may be crystallized due to the disturbance when the number of write operations to the selected memory cell reaches 1E8 cycles (1E8=6 s/60 ns) or the selected memory cell becomes the overwritten memory cell. In such case, the threshold number of write operations may be 1E8, and the interrupt control is performed when the number of write operations to the selected memory cell reaches 1E8 or the selected memory cell becomes the overwritten memory cell.

Figure 8:
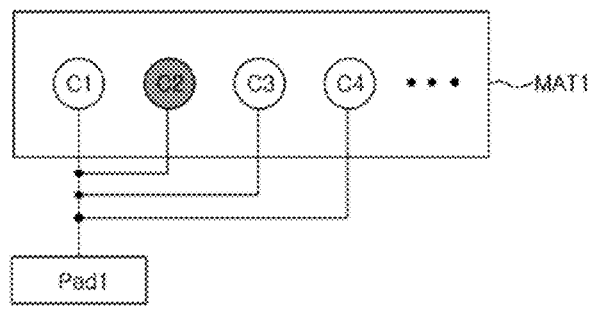
FIG. 8 is a conceptual view illustrating a method for operating a resistive memory apparatus in accordance with an embodiment of the present disclosure.

FIG. 8 is a conceptual view illustrating a method for operating a resistive memory apparatus in accordance with an embodiment of the present disclosure.

It is assumed that a cell C2 of a mat MAT1 in the resistive memory apparatus has become the overwritten memory cell or the number of write operations to the cell C2 has reached the predetermined threshold number of write operations, and the overwritten cell C2 is currently provided with data through a data input/output pad Pad1 for the write operation. The controller 150 may perform the Interrupt control. As an example of the Interrupt control, the controller 150 may perform the write operation with the provided data to a cell C4 instead the overwritten memory cell C2, and may generate and manage the address mapping table representing the mapping relationship between addresses for access to the cells C2 and C4. Since an additional write operation to the overwritten memory cell C2 may affect the adjacent memory cells C1 and C3, the cell substitution of the cell C4, which may not be affected by the disturbance of the overwritten memory cell C2, may prevent an additional write operation to the overwritten memory cell C2, and thus may avoid disturbance of the adjacent memory cells C1 and C3 allowing them to maintain their resistive states.

In accordance with an embodiment of the present disclosure, it is also possible for the controller 150 to perform the write operation with the provided data to the adjacent memory cell C3 instead the overwritten memory cell C2, and to generate and manage the address mapping table representing the mapping relationship between addresses for access to the cells C2 and C3 when the adjacent memory cell C3 has a crystalline state while the adjacent memory cell C1 has an amorphous state.

In accordance with an embodiment of the present disclosure, the controller 150 may perform a refresh operation to the adjacent cells C1 and C3 of the overwritten memory cell C2. After the refresh operation to the adjacent memory cells C1 and C3, an additional write operation to the overwritten memory cell C2 may not affect the adjacent memory cells C1 and C3 to be changed from the amorphous state to the crystalline state due to the disturbance, and the refresh operation to the adjacent memory cell may allow the resistive states of the adjacent cells C1 and C3 to be retained.

In accordance with an embodiment of the present disclosure, it is also possible for the controller 150 to perform the refresh operation only to the adjacent memory cell C1 of the overwritten memory cell C2 when the adjacent memory cell C3 has a crystalline state while the adjacent memory cell C1 has an amorphous state.

Figure 9:
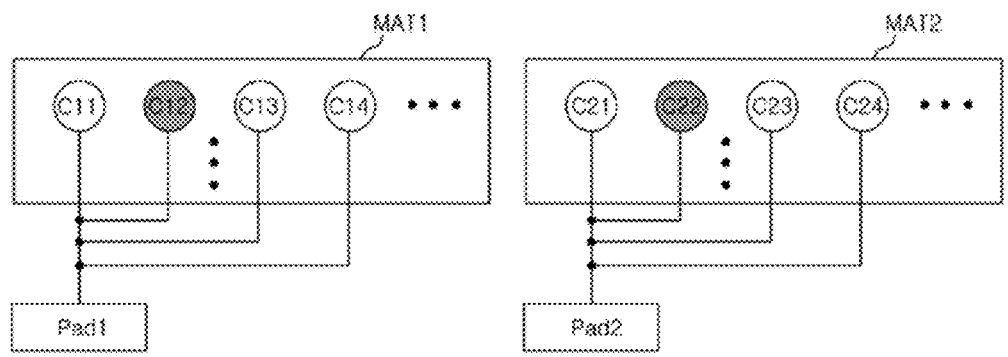
FIG. 9 is a conceptual view illustrating a method for operating a resistive memory apparatus in accordance with an embodiment of the present disclosure.
Figure 9:
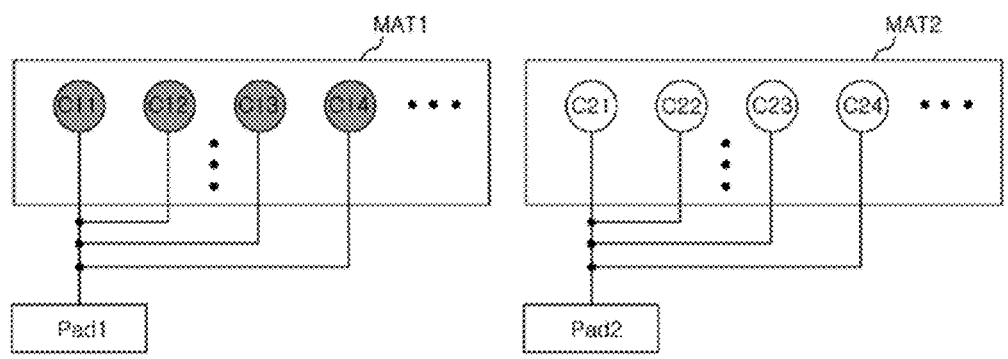

FIG. 9 is a conceptual view illustrating a method for operating a resistive memory apparatus in accordance with an embodiment of the present disclosure.

The memory region 110 may include a plurality of mats as described above with reference to FIG. 3. In general, as shown in FIG. 9 (*a*), the write operation is performed to selected cells electrically coupled to columns in a plurality of mats MAT1 and MAT2. For example, the write operation may be performed with the data provided from data input/output pads Pad1 and Pad2 to a cell C12 of the mat MAT1 and a cell C22 of the mat MAT2, respectively.

As the write operations to the memory cells C12 and C22 are repeated, the memory cells C12 and C22 may become overwritten memory cells and thus the adjacent memory cells C11, C13, C21 and C23 may be affected to a change from the amorphous state to the crystalline state by disturbance of the overwritten memory cells C12 and C22 of the mats MAT1 and MAT2, respectively.

In accordance with an embodiment of the present disclosure to prevent the disturbance to the adjacent memory cells, the controller 150 may store in advance the predetermined threshold number of write operations, based on the activation energy (Ea) of the memory region 110, and write pulse duration (S101 of FIG. 7).

Further, as shown in FIG. 9 (*b*), the controller 150 may perform the cell substitution such that the write operation may be performed for memory cells in a mat, for example the mat MAT1, instead of different mat, for example the mat MAT2, indicated by an original addresses for access to memory cells in the mat MAT2. The controller 150 may generate and manage the address mapping table representing the mapping relationship between addresses for access to the cells of the mats MAT1 and MAT2. For example, in response to a write command with an address for access to the memory cell C22 of the mat MAT2, the controller 150 may perform the write operation to a memory cell C11 in the mat MAT1 instead of the memory cell C22 of the mat MAT2, which is indicated by the original addresses. The controller 150 may generate and manage the address mapping table representing the mapping relationship between addresses for access to the cells C11 and C22 of the mats MAT1 and MAT2. In such way, when write commands for the cell C12 of the mat MAT1 and the cell C22 of the mat MAT2 is provided, addresses may be substituted such that the write operations may be performed for all the cells C11, C12, C13 and C14 of the mat MAT1, instead of write operation to the cell C22 of the mat MAT2.

When the controller 150 detects the overwritten memory cell in the mat MAT1, the controller 150 may perform the interrupt control in such a manner that data stored in the mat, for example the mat MAT1, including the overwritten memory cell may be collectively moved to another mat, for example the mat MAT2, which does not include the overwritten memory cell, and the data of the mat MAT1 including the overwritten memory cell are collectively erased.

That is to say, the controller 150 may perform the cell substitution so that the write operations may be performed to one or more predetermined mats among a plurality of mats in the memory region 110 instead of an original mat indicated by an original addresses for access to memory cells in the original mat. The controller 150 may generate and manage the address mapping table representing the mapping relationship between addresses for access to the predetermined mats and the original mat. When the controller 150 detects the overwritten memory cell in the predetermined mat while performing the write operations to the predetermined mats, the controller 150 may perform the interrupt control in such a manner that data stored in the predetermined mat, including the overwritten memory cell, may be collectively moved to another mat which does not include the overwritten memory cell and the data of the predetermined mat including the overwritten memory cell are collectively erased. The controller 150 may also generate and manage the address mapping table representing the mapping relationship between addresses for access to the predetermined mats and another mat.

Figure 10:
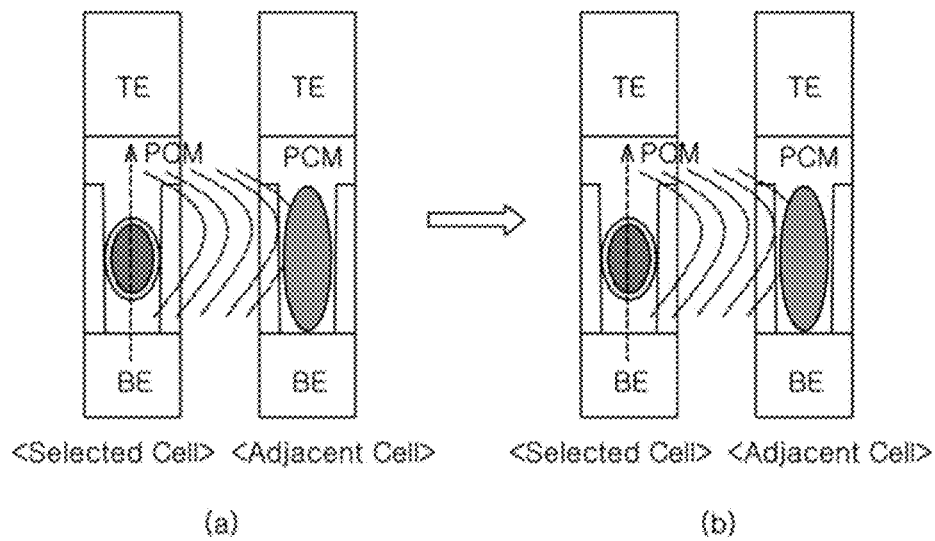
FIG. 10 is a diagram illustrating a disturbance suppression of the resistive memory apparatus in accordance with an embodiment of the present disclosure.

FIG. 10 is a diagram illustrating a disturbance suppression of the resistive memory apparatus in accordance with an embodiment of the present disclosure.

Referring to FIG. 10 (a), it may be seen that heat is radiated to the data storage material of an adjacent cell each time a write operation is performed for a selected cell.

In the present disclosure, the number of write operations for a selected cell is counted, and, when a counting result reaches the threshold number of times or the selected cell becomes the overwritten memory cell, write operations may be performed by selecting another cell, which is not adjacent to the overwritten cell, or refresh operation may be performed for the adjacent cell of the overwritten memory cell. Accordingly, as shown in FIG. 10 (b), even when an additional write operation is repeatedly performed for the overwritten memory cell, the adjacent cell of the overwritten memory cell may be retained as original.

Figure 11:
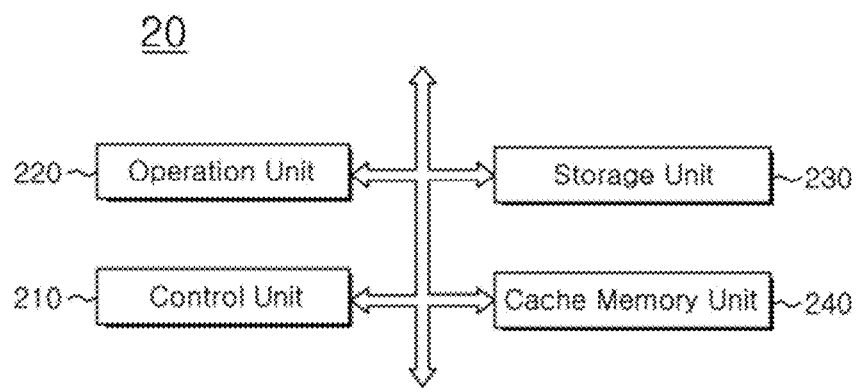
FIG. 11 is a block diagram illustrating a processor in accordance with an embodiment of the present disclosure.

FIG. 11 is a block diagram illustrating a processor in accordance with an embodiment of the present disclosure.

Referring to FIG. 11, a processor 20 may include a control unit 210, a calculation unit 220, a storage unit 230, and a cache memory unit 240.

The control unit 210 receives signals, such as commands and data, from an external device, decodes commands, performs input or output of data, and processes data, thereby controlling the general operations of the processor 20.

The operation unit 220 performs various operations according to results of decoding commands by the control unit 210. The operation unit 220 may include at least one arithmetic and logic unit (ALU).

The storage unit 230 may serve as a register and is a part which stores data in the processor 20. The storage unit 230 may include a data register, an address register, a floating point register, and various other registers. The storage unit 230 may store data to be calculated by the operation unit 220, calculation result data, and addresses at which those data are stored.

The storage unit 230 may include a memory region constituted by resistive memory cells, an address decoder, a controller, and a voltage generator, for example. In an embodiment of the present disclosure, the storage unit 230 may be the resistive memory apparatus shown in FIG. 2. Thus, when performing a write operation for the memory region according to the write command and the write data provided from the control unit 210, the numbers of write operations for respective memory cells are cumulatively counted. Further, where a cell reaches that reaches a predetermined threshold number of write times is detected, interrupt control is performed. In another embodiment, when a simultaneous write command for respective specified columns in a plurality of mats is generated, the storage unit 230 primarily substitutes addresses such that all cells in the same mat are written. If a mat which reaches a data retention failure time is detected, any one mat which does not reach the data retention failure time may be selected, the data of the detected mat is collectively moved, addresses are secondarily substituted, and then the data of memory cells in the detected mat are erased.

The cache memory unit 240 serves as a temporary storage space.

The processor 20 illustrated in FIG. 11 may be a central processing unit (CPU), a graphic processing unit (GPU), a digital signal processor (DSP), an application processor (AP) or the like of an electronic apparatus.

Figure 12:
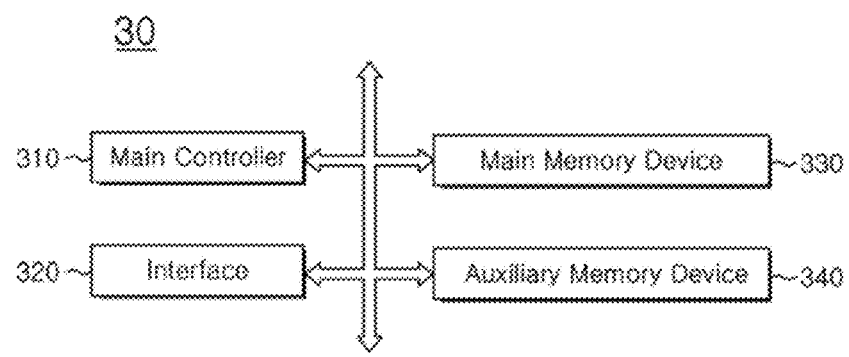
FIGS. 12 and 13 are block diagrams illustrating data processing systems in accordance with an embodiment of the present disclosure.
Figure 13:
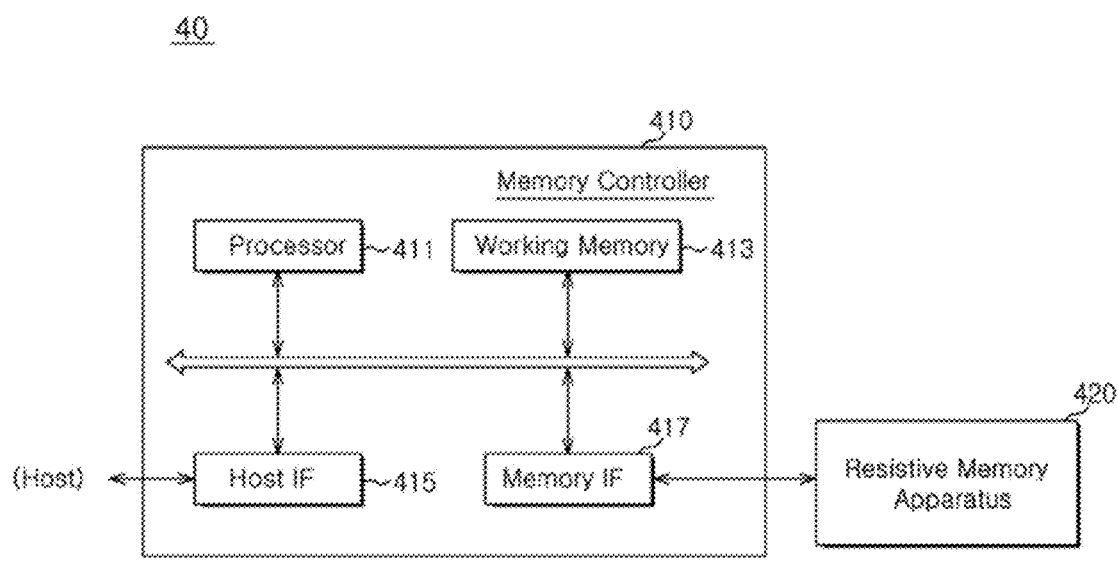

FIGS. 12 and 13 are block diagrams illustrating data processing systems in accordance with an embodiment of the present disclosure.

The data processing system 30 illustrated in FIG. 12 may include a main controller 310, an interface 320, a main memory device 330, and an auxiliary memory device 340.

The data processing system 30 may perform input, processing, output, communication, and storage, in order to perform a series of operations for processing data. The data processing system 30 may be an electronic apparatus such as a computer server, a personal digital assistant, a notebook computer, a web tablet computer, a wireless terminal, a mobile communication terminal, a digital contents player, a camera, a global positioning system, a video camera, a recorder, a telematics device, an AV system, a smart TV, and the like.

In another embodiment, the data processing system 30 may be a data storage device, and may be a disk type such as a hard disk, an optical drive, a solid state disk, a DVD, or the like, or a card type such as a universal serial bus (USB) memory, a secure digital (SD) card, a memory stick, a smart media card, an internal/external multimedia card, a compact flash card, or the like.

The main controller 310 controls data exchange through the main memory device 330 and the interface 320. To this end, the main controller 310 controls general operations of decoding the commands inputted through the interface 320 from an external device, and calculating and comparing the data stored in the system.

The interface 320 provides an environment in which commands and data may be exchanged between the external device and the data processing system 30. The interface 320 may be a man-machine interface device, a card interface device or a disk interface device, depending on the applied environment of the data processing system. The man-machine interface device may include an input device such as a keyboard, a keypad, a mouse and a voice recognition device and an output device such as a display and a speaker. The disk interface device may include IDE (Integrated Drive Electronics), SCSI (Small Computer System Interface), SATA (Serial Advanced Technology Attachment), eSATA (External SATA), PCMCIA (Personal Computer Memory Card International Association), or the like.

The main memory device 330 may store applications, control signals, and data, which are needed for the data processing system 30 to operate. The main memory device 330 serves as storage to and from which a program or data may be transferred from the auxiliary memory device 340 and may be executed. The main memory device 330 may be realized using a memory device having nonvolatile properties. For example, the resistive memory apparatus shown in FIG. 2 may be used as the main memory device 330.

The auxiliary memory device 340 is a space for storing program codes or data, and may include a high-capacity memory device. For example, the resistive memory apparatus illustrated in FIG. 2 may be used as the auxiliary memory device 340.

That is to say, the main memory device 330 and/or the auxiliary memory device 340 may include a memory region constituted by resistive memory cells, an address decoder, a controller, and a voltage generator, for example. Thus, when performing write for the memory region according to the write command and the write data provided from the main controller 310, the numbers of write operations for respective memory cells are cumulatively counted. Further, where a cell has reached a predetermined threshold number of write times is detected, an interrupt control is performed. In another respect, when a simultaneous write command for specified columns in a plurality of mats is generated, addresses are primarily substituted such that all cells in the same mat are written. If a mat which reaches a data retention failure time is detected, any one mat which does not reach the data retention failure time may be selected, the data of the detected mat are collectively moved, addresses are secondarily substituted, and then the data of memory cells in the detected mat are erased.

The data processing system 40 illustrated in FIG. 13 may include a memory controller 410 and a resistive memory apparatus 420.

The memory controller 410 may access the resistive memory apparatus 420 in response to a request from a host. To this end, the memory controller 410 may include a processor 411, a working memory 413, a host interface 415, and a memory interface 417.

The processor 411 may control the general operations of the memory controller 410, and the working memory 413 may store applications, data, control signals, and so forth, which are needed for the memory controller 410 to operate.

The host interface 415 may perform protocol conversion for exchange of data/control signals between the host and the memory controller 410, and the memory interface 417 may perform protocol conversion for exchange of data/control signals between the memory controller 410 and the resistive memory apparatus 420.

The resistive memory apparatus 420 may use, for example, the resistive memory apparatus shown in FIG. 2, and may include a memory region constituted by resistive memory cells, an address decoder, a controller, and a voltage generator. Thus, when writing for the memory region according to the write command and the write data provided from the memory controller 410, the numbers of write operations for respective memory cells are cumulatively counted. Further, where a cell which reaches a predetermined threshold number write operations is detected, interrupt control is performed. When a simultaneous write command for specified columns in a plurality of mats is generated, addresses are primarily substituted such that all cells in the same mat are written. If a mat which reaches a data retention failure time is detected, any one mat which does not reach the data retention failure time may be selected, the data of the detected mat are collectively moved, addresses are secondarily substituted, and then the data of memory cells in the detected mat are erased.

The data processing system 40 illustrated in FIG. 13 may be utilized as a disk device, an internal/external memory card of a portable electronic appliance, an image processor, or an application chip set.

Furthermore, the working memory 413 provided in the memory controller 410 may also be realized using the memory apparatus illustrated in FIG. 2.

Figure 14:
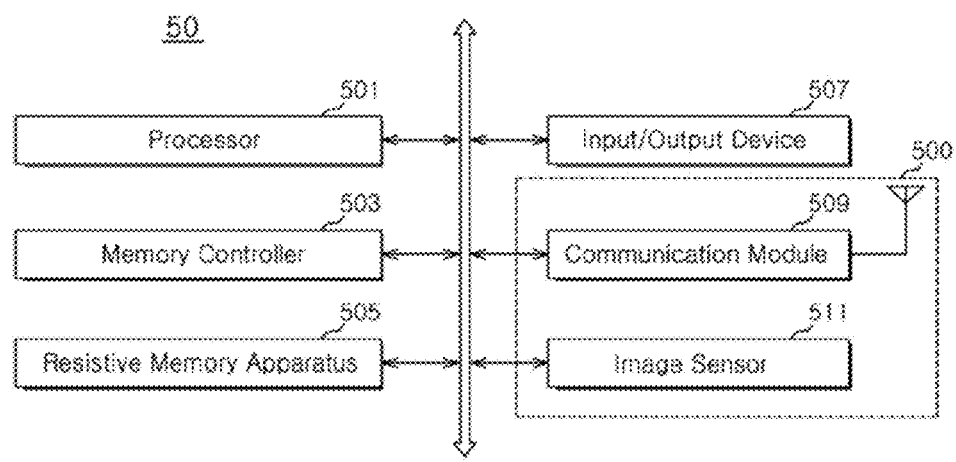
FIGS. 14 and 15 are block diagrams illustrating electronic systems in accordance with an embodiment of the present disclosure.
Figure 15:
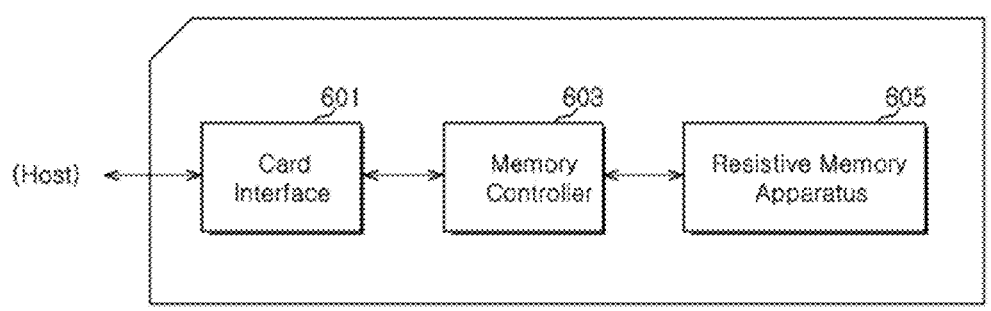

FIGS. 14 and 15 are block diagrams illustrating electronic systems in accordance with an embodiment of the present disclosure.

The electronic system 50 illustrated in FIG. 14 may include a processor 501, a memory controller 503, a resistive memory apparatus 505, an input/output device 507, and a function module 500.

The memory controller 503 may control a data processing operation of the resistive memory apparatus 505, for example, a write or read operation, under the control of the processor 501.

The data written in the resistive memory apparatus 505 may be outputted through the input/output device 507 under the control of the processor 501 and the memory controller 503. The input/output device 507 may include a display device, a speaker device, and so forth.

The input/output device 507 may also include an input device through which a control signal for controlling the operation of the processor 501 or data to be processed by the processor 501 may be inputted.

In another embodiment, the memory controller 503 may be realized as part of the processor 501 or a chip set separate from the processor 501.

The resistive memory apparatus 505 may include a memory region constituted by resistive memory cells, an address decoder, a controller, and a voltage generator, for example. In an embodiment of the present disclosure, the resistive memory apparatus 505 may be the resistive memory apparatus shown in FIG. 2. Thus, when performing write operations for the memory region according to the write command and the write data provided from the memory controller 503, the numbers of write operations for respective memory cells are cumulatively counted. Further, where a cell that reaches a predetermined threshold number of write times is detected, interrupt control is performed. In another respect, when a simultaneous write command for specified columns in a plurality of mats is generated, addresses are primarily substituted such that all cells in the same mat are written. If a mat which reaches a data retention failure time is detected, any one mat which does not reach the data retention failure time may be selected, the data of the detected mat is collectively moved, addresses are secondarily substituted, and the data of memory cells in the detected mat is erased.

The function module 500 may be a module capable of performing a selected function according to an application example of the electronic system 50 illustrated in FIG. 14. FIG. 14 illustrates a communication module 509 and an image sensor 511 as an example of the function module 500.

The communication module 509 may provide a communication environment in which the electronic system 50 may access a wired or wireless communication network and exchange data and control signals.

The image sensor 511 converts an optical image into digital image signals and transmits the digital image signals to the processor 501 and the memory controller 503.

When the electronic system 50 of FIG. 14 is provided with the communication module 509, the electronic system 50 may operate as a portable communication appliance such as a wireless communication terminal. When the electronic system 50 is provided with the image sensor 511, the electronic system 50 may be an electronic system (for example, a PC, a notebook computer, a mobile communication terminal or the like) which is attached with a digital camera or a digital camcorder.

The electronic system 60 illustrated in FIG. 15 may include a card interface 601, a memory controller 603, and a resistive memory apparatus 605.

The electronic system 60 illustrated in FIG. 15 is an exemplary embodiment of a memory card or a smart card, and may be any one of a PC card, a multimedia card, an embedded multimedia card, a secure digital card, and a USB drive.

The card interface 601 interfaces exchange of data between a host and the memory controller 603, according to the protocol of the host. In an embodiment, the card interface 601 may mean hardware capable of supporting the protocol used by the host, a software mounted on the hardware which supports the protocol used by the host, or a signal transmission scheme.

The memory controller 603 controls exchange of data between the resistive memory apparatus 605 and the card interface 601.

The resistive memory apparatus 605 may use the resistive memory apparatus shown in FIG. 2. That is to say, the resistive memory apparatus 605 may include a memory region constituted by resistive memory cells, an address decoder, a controller, and a voltage generator. Thus, when performing writing operations for the memory region according to the write command and the write data provided from the memory controller 603, the numbers of write operations for respective memory cells are cumulatively counted. Further, where a cell that reaches a predetermined threshold number of write times is detected, interrupt control is performed. In another respect, when a simultaneous write command for respective specified columns in a plurality of mats is generated, addresses are primarily substituted such that all cells in the same mat are written. If a mat that reaches a data retention failure time is detected, any one mat which does not reach the data retention failure time may be selected, the data of the detected mat are collectively moved, addresses are secondarily substituted, and then the data of memory cells in the detected mat are erased.

While certain embodiments have been described above, it will be understood to those skilled in the art that the embodiments described are by way of example only. Accordingly, the resistive memory apparatus and the operation method thereof described herein should not be limited based on the described embodiments. Rather, the resistive memory apparatus and the operation method thereof described herein should only be limited in light of the claims that follow when taken in conjunction with the above description and accompanying drawings.

What is claimed is:

1. A resistive memory apparatus comprising:
   a memory region including a plurality of resistive memory cells; and
   a controller suitable for storing a threshold number of write operations according to a kind of a data storage material of the resistive memory cells, counting numbers of write operations for the respective resistive memory cells as write operations are performed for the memory region, and performing interrupt control when a memory cell that reaches the threshold number of write operations is detected.

2. The resistive memory apparatus according to claim 1, wherein the controller performs the interrupt control in such a way as to substitute a memory cell, to which a write operation is to be performed, in response to a write command for the detected memory cell.

3. The resistive memory apparatus according to claim 2, wherein the controller performs the write operation by selecting a substitution memory cell, which is not adjacent to the detected memory cell, in response to the write command for the detected memory cell, and generates and manages an address table by mapping an original address, which indicates the detected memory cell and a substitution address, which indicates the substitution memory cell.

4. The resistive memory apparatus according to claim 1, wherein the interrupt control comprises performing a refresh operation to an adjacent cell of the detected memory cell.

5. The resistive memory apparatus according to claim 4, wherein the interrupt control further comprises a write operation to the detected memory cell.

6. The resistive memory apparatus according to claim 1, wherein the resistive memory cells are phase change memory cells, and the controller performs the interrupt control according to crystal states of the detected memory cell and the adjacent memory cell.

7. The resistive memory apparatus according to claim 6, wherein the controller performs the interrupt control when the detected memory cell and the adjacent memory cell are in an amorphous state.

8. The resistive memory apparatus according to claim 1,
   wherein the memory region includes a plurality of mats, and
   wherein, in response to write commands for the plurality of mats, the controller substitutes addresses such that write operations for the write commands are performed to a first mat of the plurality of mats.

9. The resistive memory apparatus according to claim 8, wherein when the first mat includes the detected memory cell, the controller collectively moves data of the first mat to a second mat, which does not include the detected memory cell, substitutes addresses such that write operations for the write commands are performed to the second mat, and erases data in the first mat.

10. A method for operating a resistive memory apparatus including a controller suitable for controlling a write operation for a memory region including a plurality of resistive memory cells, and for storing a threshold number of write operations according to a kind of a data storage material of the resistive memory cells, the method comprising:
    counting write operations for the respective resistive memory cells as a write operation is performed for the memory region; and
    performing interrupt control when a memory cell that reaches the threshold number of write operations is detected.

11. The method according to claim 10, wherein the performing of the interrupt control substitutes a memory cell, to which a write operation is to be performed, in response to a write command for the detected memory cell.

12. The method according to claim 11, wherein the performing of the interrupt control performs the write operation by selecting a substitution memory cell, which is not adjacent to the detected memory cell, in response to the write command for the overwritten memory cell, and generates an address table by mapping an original address, which indicates the detected memory cell and a substitution address, which indicates the substitution memory cell.

13. The method according to claim 10, wherein the performing of the interrupt control comprises a refresh operation to an adjacent cell of the detected memory cell.

14. The method according to claim 13, wherein the performing of the interrupt control comprises a write operation to the detected memory cell in response to the write command for the detected memory cell after the interrupt control.

15. The method according to claim 10, wherein the resistive memory cells are phase change memory cells, and the performing of the interrupt control is dependent on crystal states of the detected memory cell and the adjacent memory cells.

16. The method according to claim 15, wherein the interrupt control is performed when the detected memory cell and the adjacent memory cell are in an amorphous state.

17. The method according to claim 10,
    wherein the memory region comprises a plurality of mats, and
    wherein, the performing of the interrupt control substitutes addresses in response to write commands for the plurality of mats such that write operations for the write commands are performed to a first mat of the plurality of mats.

18. The method according to claim 17, wherein when the first mat includes the detected memory cell, the performing of the interrupt control collectively moves data of the first mat to a second mat, which does not include the detected memory cell, substitutes addresses such that write operations for the write commands are performed to the second mat, and erases data in the first mat.

19. A resistive memory apparatus comprising:
   a plurality of resistive memory cells; and
   a controller suitable for storing a threshold number of write operations according to a kind of a data storage material of the plurality of resistive memory cells, detecting an overwritten resistive memory cell from the plurality of resistive memory cells, and allowing the resistive memory apparatus to perform a write operation to another cell from the plurality of resistive memory cells in response to a write command for a write operation to the detected overwritten resistive memory cell,
   wherein a predetermined number of write operations is performed to the overwritten resistive memory cell.

20. A resistive memory apparatus comprising:
   a plurality of resistive memory cells; and
   a controller suitable for storing a threshold number of write operations according to a kind of a data storage material of the plurality of resistive memory cells, detecting an overwritten resistive memory cell from the plurality of resistive memory cells, and allowing the resistive memory apparatus to perform a refresh operation to an adjacent resistive memory cell of the detected overwritten resistive memory cell,
   wherein a predetermined number of write operations is performed to the overwritten resistive memory cell.

* * * * *